(12) United States Patent
Mitani et al.

(10) Patent No.: US 6,278,141 B1
(45) Date of Patent: Aug. 21, 2001

(54) ENHANCEMENT-MODE SEMICONDUCTOR DEVICE

(75) Inventors: Eizo Mitani; Hiroyuki Oguri, both of Yamanashi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/343,463

(22) Filed: Jun. 30, 1999

(30) Foreign Application Priority Data

Jul. 21, 1998 (JP) .................................................. 10-205620

(51) Int. Cl.$^7$ .......................... H01L 29/778; H01L 29/04
(52) U.S. Cl. ........................... 257/194; 257/627; 257/192
(58) Field of Search ................... 257/487, 192, 257/547, 188, 200, 194, 627

(56) References Cited

U.S. PATENT DOCUMENTS

| | | | |
|---|---|---|---|
| 4,558,509 | * | 12/1985 | Tiwari .................................... 257/627 |
| 4,839,703 | * | 6/1989 | Ohata et al. ............................. 357/22 |
| 5,023,674 | * | 6/1991 | Hikosaka et al. ....................... 357/16 |
| 5,039,958 | * | 8/1991 | Delhaye et al. ................. 331/117 FE |
| 5,124,762 | * | 6/1992 | Childs et al. ............................ 357/16 |
| 5,159,414 | * | 10/1992 | Izumi et al. ............................. 357/22 |
| 5,227,644 | * | 7/1993 | Ueno ...................................... 257/20 |
| 5,945,718 | * | 8/1999 | Passlack et al. ...................... 257/410 |

FOREIGN PATENT DOCUMENTS

| | | |
|---|---|---|
| 58-135681 | 8/1983 | (JP) . |
| 64-770 | 1/1989 | (JP) . |
| 8-288305 | 11/1996 | (JP) . |

OTHER PUBLICATIONS

Onodera, T., et al. IEEE Transactions on Electronic Devices, vol. 36, No. 9, pp. 1580–1585, Sep. 1989.

Onodera, T., et al. IEEE Transactions on Electronic Devices, vol. 36, No. 9, pp. 1586–1590, Sep. 1989.

* cited by examiner

*Primary Examiner*—Jerome Jackson, Jr.
(74) *Attorney, Agent, or Firm*—Armstrong, Westerman, Hattori, McLeland & Naughton, LLP

(57) ABSTRACT

An enhancement-mode semiconductor device includes a barrier layer formed on a channel layer and a gate electrode provided on the barrier layer, wherein the gate electrode is formed with an orientation chosen so as to maximize a threshold voltage of the semiconductor device.

6 Claims, 6 Drawing Sheets

US 6,278,141 B1

ENHANCEMENT-MODE SEMICONDUCTOR DEVICE

BACKGROUND OF THE INVENTION

The present invention generally relates to semiconductor devices and more particularly to a compound semiconductor device operating in an enhancement-mode.

Compound semiconductor devices have an advantageous feature of high operational speed due to the small effective mass of electrons. Further, in view of low operational voltage, compound semiconductor devices are used extensively in electronic apparatuses for use in ultra-high frequency applications including mobile telephones and portable telephones. Conventionally, depletion-mode compound semiconductor devices have been used successfully in such ultra-high frequency applications for the final stage power transistor.

On the other hand, the use of such a depletion-mode power transistor has caused the problem that a negative voltage source has to be provided in the electronic apparatus in addition to a positive voltage source for driving the depletion-mode power transistor. In relation to the use of the additional voltage source, it has been difficult, in conventional electronic apparatuses having a depletion-mode compound semiconductor device as a power transistor, to reduce the size and cost or power consumption.

Meanwhile, compound semiconductor devices of the enhancement-mode have an advantageous feature in that the negative voltage source is not necessary. Thereby, the enhancement-mode compound semiconductor devices are promising devices for reducing the size and cost or power consumption of the electronic apparatus.

When using an enhancement-mode compound semiconductor device in such ultra-high frequency applications, it is desired to reduce the leakage current in the turn-off state thereof and increase the current density in the turn-on state as much as possible, so that high output power and high efficiency are achieved.

In an enhancement-mode power FET, on the other hand, the turn-off state leakage current and the turn-on state current density are generally in a trade-off relationship, and it has been difficult to increase the turn-on state current density and simultaneously minimize the turn-off state leakage current.

FIG. 1 shows the construction of a typical enhancement-mode MESFET 10 having a diffusion region.

Referring to FIG. 1, the MESFET 10 is formed on a semi-insulating GaAs substrate 11 and includes a GaAs channel layer 12 of the n-type formed on the substrate 11, wherein a gate electrode 13A is formed on the channel layer 12 in correspondence to a channel region CH defined in the channel layer 12. Further, the channel layer 12 is formed with diffusion regions 12A and 12B of the n-type at respective lateral sides of the gate electrode 13A, such that the diffusion regions 12A and 12B reach the GaAs substrate 11. Further, ohmic electrodes 13B and 13C are formed on the diffusion regions 12A and 12B respectively, and a passivation film 14 is provided on the channel layer 12 so as to cover the gate electrode 13A and the ohmic electrodes 13B and 13C.

In the enhancement-mode MESFET 10 of FIG. 1, it is necessary to increase the threshold voltage $V_{th}$ in order to reduce the leakage current in the turn-off state, wherein the threshold voltage $V_{th}$ is represented, in the injection type MESFET of FIG. 1, as $$V_{th}=V_{bi}-qN_d a^2/2\epsilon,$$

wherein $N_d$ and a represent respectively the impurity concentration level and the thickness of the channel layer 12.

From the equation above, it is understood the impurity concentration level $N_d$ or the thickness a of the channel layer 12 has to be reduced when to increase the magnitude of the threshold voltage $V_{th}$.

On the other hand, the characteristic curve of FIG. 2 indicates that the drain current $I_{ds}$ is reduced also when the impurity concentration level $N_d$ or the thickness a of the channel layer 12 is reduced. It should be noted that FIG. 2 represents the relationship between the drain current $I_{ds}$ and the gate voltage $V_{gs}$. In other words, the relationship of FIG. 2 indicates that the maximum current density in the turn-on state of the MESFET 10 is reduced inevitably when the impurity concentration level $N_d$ in the channel layer 12 is reduced or the thickness a of the channel layer 12 is reduced for suppressing the turn-off state leakage current.

On the other hand, it has been known that the threshold voltage $V_{th}$ of a compound semiconductor device such as a MESFET is affected by the orientation of the gate electrode. Reference should be made, for example, to the Japanese Laid-Open Patent Publication 64-000770 or to the Japanese Laid-Open Patent Publication 57-135681. In relation to such a shift of the threshold voltage $V_{th}$, caused by the setting of the gate electrode orientation on the compound semiconductor substrate, there is a stress analysis presented by Onodera (Onodera, T. et al., IEEE ED vol. 36, no. 9, pp. 1580–1590), concluding that such a change of the threshold voltage $V_{th}$ is caused as a result of the piezoelectric charges induced in the channel layer 12 in correspondence to the part right underneath the gate electrode 13A as represented in FIG. 3.

FIG. 4 represents the definition of the crystal orientation used in the present invention.

Referring to FIG. 4, an etch pit is formed on a (100)-oriented surface of a GaAs crystal by a wet etching process, wherein it can be seen that the crystal orientation [01$\bar{1}$] and the crystal orientation [011] are defined on the (100) surface based on the orientation of the ordinary mesa structure and the inverse mesa structure formed as a result of the wet etching process.

FIG. 5 shows the relationship between the gate length $L_g$ and the threshold voltage $V_{th}$ for the case in which the gate electrode 13A is formed in the [011] direction and also for the case in which the gate electrode 13A is formed in the [01$\bar{1}$] direction. The result of FIG. 5 assumes that the GaAs substrate 11 has a (100) principal surface.

Referring to FIG. 5, it can be seen that the threshold voltage $V_{th}$ decreases sharply with the gate length $L_g$ when the gate electrode 13A is formed in the [011] orientation. In this case, the threshold voltage $V_{th}$ drops conspicuously when the gate length $L_g$ has been reduced below 5 μm. Thereby, the operational mode of the MESFET changes to the depletion mode. On the other hand, in the case the gate electrode 13A is formed in the [01$\bar{1}$] orientation, it can be seen that the threshold voltage $V_{th}$ remains more or less constant even in such a case in which the gate length $L_g$ is reduced below 5 μm.

The result of FIG. 5 indicates that the MESFET 10 continues to operate in the enhancement-mode even in the case the gate length $L_g$ is reduced below 5 μm, as long as the gate electrode 13A is formed in the [01$\bar{1}$] orientation.

On the other hand, the characteristic curve of FIG. 6 indicates that the drain current $I_{ds}$ is reduced, when the gate electrode 13A is formed in the [01$\bar{1}$] orientation. Apparently, this is due to the effect of the piezoelectric charges induced in the channel layer 12 in correspondence to the channel region CH right underneath the gate electrode 13A. It should be noted that FIG. 6 is a diagram similar to FIG. 2 and shows the relationship between the drain current $I_{ds}$ and the gate voltage $V_{gs}$.

Further, in view of the fact that the gate turn-on voltage has a constant value of about 0.8 V in the construction of FIG. 1, in which the gate electrode 13A makes a direct Schottky contact with the channel layer 12, it has been difficult to construct an enhancement-mode MESFET having a threshold voltage $V_{th}$ exceeding 0.3 V, even if the gate electrode is formed with the [01$\bar{1}$] orientation. It should be noted that the foregoing constant gate turn-on voltage of about 0.8 V is determined by the Schottky barrier height formed between the gate electrode 13A and the channel layer 12.

In such a MESFET 10 having the characteristic of FIG. 6, it should be noted that the drain current $I_{ds}$ starts to decrease when the gate voltage $V_{gs}$ is applied with a magnitude exceeding the limit represented in FIG. 6 by a broken line. In such a case, there merely occurs an increase in the gate leakage current. Thus, in the MESFET 10 of FIG. 1, it is not appropriate to increase the gate voltage $V_{gs}$ beyond the foregoing limit. No further increase of the drain current $I_{ds}$ is expected even in the case the gate electrode 13A is formed with the [01$\bar{1}$] orientation.

Meanwhile, there is proposed a so-called HFET (heterostructure FET) in which the channel layer 12 of the MESFET 10 of FIG. 1 is covered by a high-resistance film of a compound semiconductor material having an increased bandgap. In an HFET, the gate electrode 13A and the source and drain electrodes 13A, 13B are formed on such a high-resistance compound semiconductor layer. Because of the existence of the high-resistance compound semiconductor layer between the gate electrode 13A and the channel layer 12, the HFET can successfully minimize the gate leakage current.

In the case of such an HFET, however, it was not obvious at all whether or not the piezoelectric charges are induced in the channel layer 12 in correspondence to the gate electrode 13A. The existence of the foregoing high-resistance layer between the channel layer 12 and the gate electrode 13A may change the stress field in the channel layer 12 drastically. Further, it is not obvious whether or not the optimization in the orientation of the gate electrode explained before with reference to the MESFET 10 of FIG. 1 is applicable to such an HFET. There has been no investigation about the optimization of the gate electrode orientation in an HFET.

SUMMARY OF THE INVENTION

Accordingly, it is a general object of the present invention to provide a novel and useful semiconductor device wherein the foregoing problems are eliminated.

Another and more specific object of the present invention is to provide a high-speed compound semiconductor device of the enhancement-mode wherein the leakage current in the turn-off state is minimized and simultaneously the current density in the turn-on state is maximized.

Another object of the present invention is to provide an enhancement-mode semiconductor device, comprising:
  a channel layer;
  a barrier layer formed on said channel layer, said barrier layer having a bandgap larger than a bandgap of said channel layer;
  a gate electrode provided on said barrier layer;
  a pair of diffusion regions formed in said barrier layer at both lateral sides of said gate electrode, each of said diffusion regions reaching said channel layer;
  a pair of ohmic electrodes formed respectively on the pair of diffusion regions;
  said gate electrode being formed with an orientation chosen so as to maximize a threshold voltage of said semiconductor device.

According to the present invention, it becomes possible to minimize the gate leakage current by providing the barrier layer between the substrate and the gate electrode even when a large gate voltage $V_{gs}$ is applied to the gate electrode. Thereby, the current density in the turn-on state is maximized. Further, by setting the orientation of the gate electrode so as to maximize the threshold voltage, the leakage current in the turn-off state of the compound semiconductor device is minimized. In other words, the requirement of the increased current density in the turn-on state and the requirement of the minimized leakage current in the turn-off state are compatible in the compound semiconductor device of the present invention.

Other objects and further features of the present invention will become apparent from the following detailed description when read conjunction with the attached drawings.

DETAILED DESCRIPTION OF THE PREFERRED EMBODIMENTS

[Principle]

Figure 1:
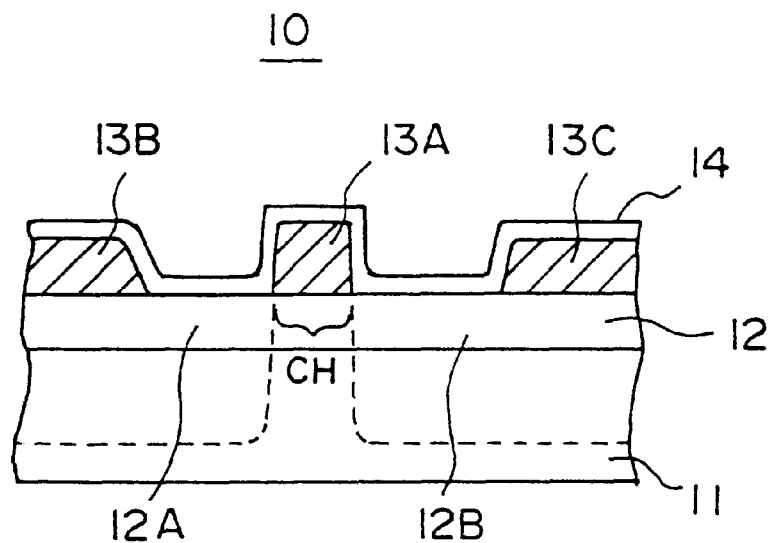
FIG. 1 is a diagram showing the construction of a conventional MESFET.
Figure 2:
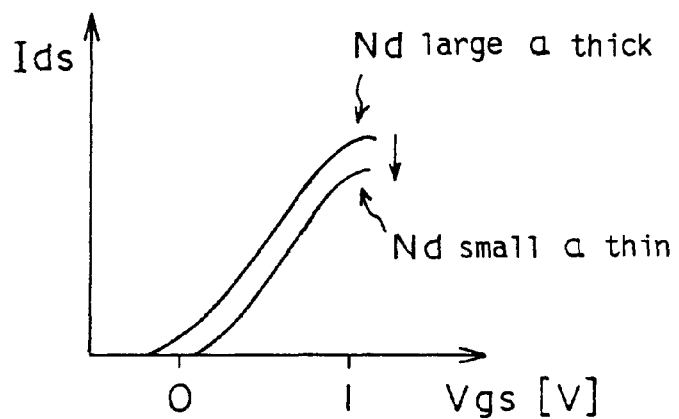
FIG. 2 is a diagram showing the operational characteristics of the MESFET of FIG. 1.
Figure 3:
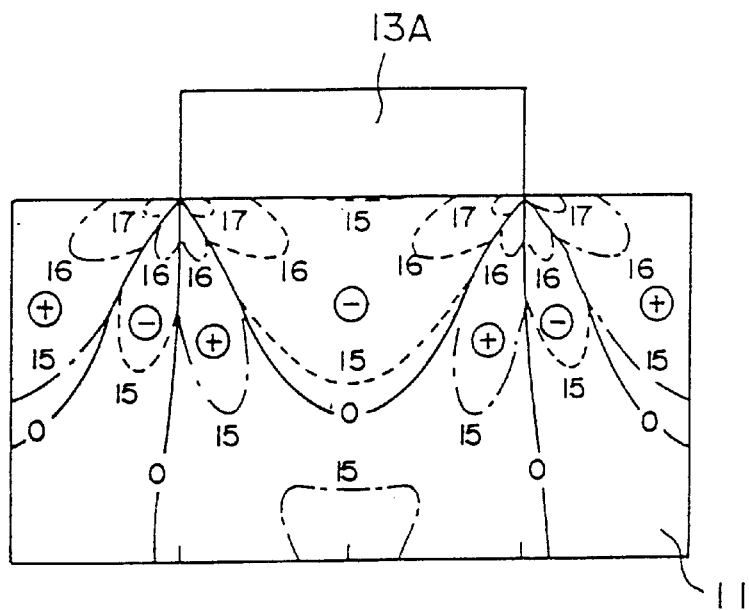
FIG. 3 is a diagram showing the distribution of piezoelectric charges induced in a GaAs substrate in correspondence to a gate electrode.
Figure 4:
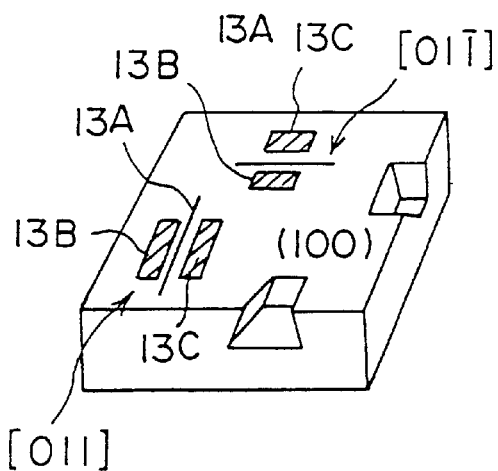
FIG. 4 is a diagram defining the crystal orientation used in the present invention.
Figure 5:
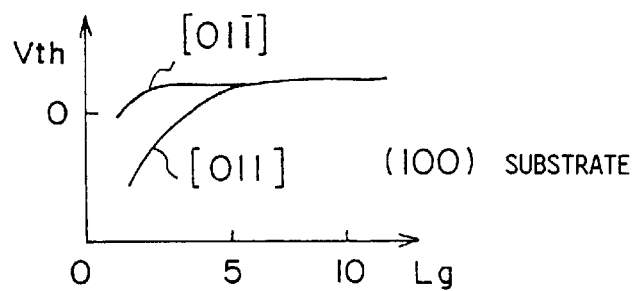
FIG. 5 is a diagram showing the effect of piezoelectric charges in the MESFET of FIG. 1.

The inventor of the present invention has discovered that an enhancement-mode HFET having a construction similar to that of the MESFET of FIG. 1 but with a high-resistance barrier layer having an increased bandgap formed on the surface of the channel layer 12, shows a drain current characteristic that changes with the elongating direction of the gate electrode 13A.

Figure 7:
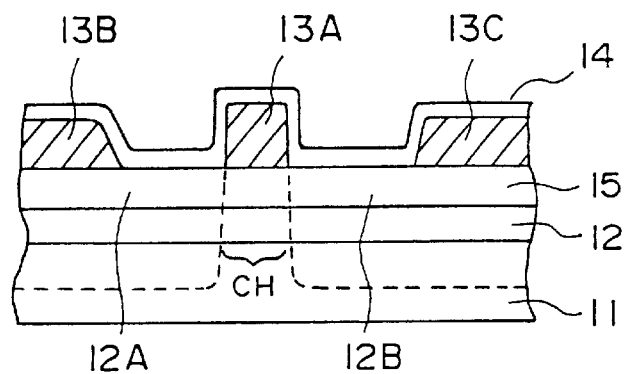
FIG. 7 is a diagram showing the principle of the HFET of the present invention.

FIG. 7 shows the fundamental construction of the enhancement-mode HFET, wherein those parts corresponding to the parts described previously are designated by the same reference numerals and the description thereof will be omitted. In FIG. 7, it should be noted that the HFET is constructed on the (100) surface of the GaAs substrate 11 similarly to the MESFET 10 of FIG. 1.

Referring to FIG. 7, the HFET includes an undoped barrier layer 15 of a wide bandgap material such as AlGaAs on the surface of the channel layer 12, and the gate electrode 13A is formed on the barrier layer 15. Further, the diffusion regions 12A and 12B are formed so as to reach the substrate 11 through the barrier layer 15 and the channel layer 12.

Figure 8:
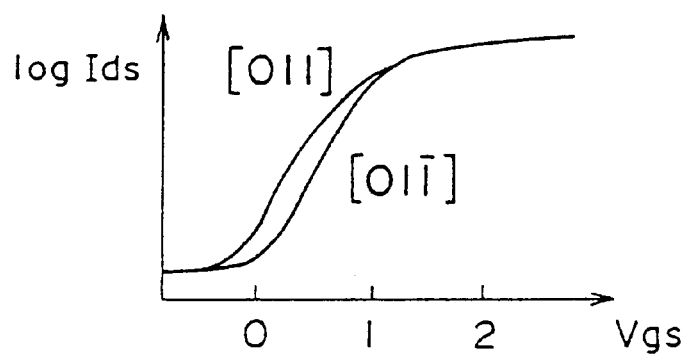
FIG. 8 is a diagram showing the effect of the piezoelectric charges in the HFET of FIG. 7.

FIG. 8 shows the relationship between the drain current $I_{ds}$ of the enhancement-mode FET of FIG. 7 and the gate voltage $V_{gs}$, wherein it should be noted that the result of FIG. 8 is for the HFET that uses GaAs of the n-type for the channel layer 12 and AlGaAs for the barrier layer 15. The HFET further uses WSi for the gate electrode 13A and SiN for the passivation film 14.

Referring to FIG. 8, it can be seen that the drain current $I_{ds}$ is smaller in the case the gate electrode 13A extends in the [01$\bar{1}$] direction than in the case the gate electrode 13A extends in the [011] direction. The result of FIG. 8 clearly indicates that negative piezoelectric charges are induced in the HFET in which the barrier layer 15 is interposed between the channel layer 12 and the gate electrode 13A according to the mechanism of Onodera, et al., op cit., similarly to the case of the FET 10 of FIG. 1. Further, the result of FIG. 8 indicates that the drain leakage current, which is a drain current for the case the gate voltage $V_{gs}$ is set to zero or below the threshold voltage $V_{th}$ and the HFET is turned off, is reduced by forming the gate electrode 13A to extend in the foregoing [01$\bar{1}$] direction than to form the gate electrode 13A to extend in the [011] direction.

Figure 6:
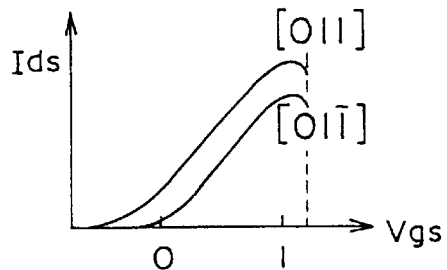
FIG. 6 is a diagram explaining the effect and problem caused by the piezoelectric charged in the MESFET of FIG. 1.

In the HFET of the present invention, the problem of gate leakage current, which occurs when a large gate voltage $V_{gs}$ is applied to the gate electrode 13A as represented in FIG. 6, is successfully avoided by interposing the high-resistance barrier layer 15 between the channel layer 12 and the gate electrode 13A. As represented in FIG. 8, the drain current $I_{ds}$ increases continuously with the gate voltage $V_{gs}$, wherein the drain current $I_{ds}$ is represented in FIG. 8 in the logarithmic scale.

Figure 9:
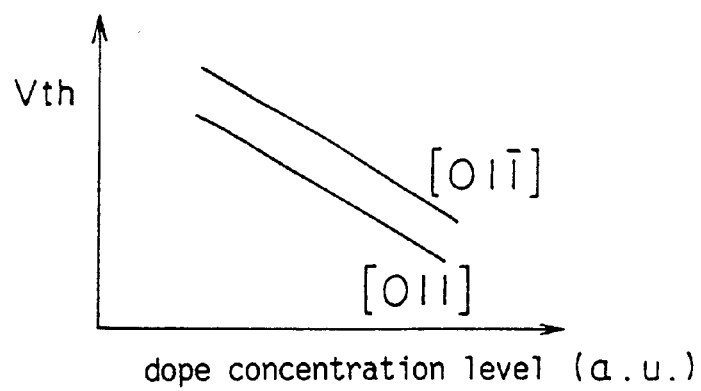
FIG. 9 is another diagram showing the effect of the piezoelectric charges in the HFET of FIG. 7.

FIG. 9 shows the threshold voltage $V_{th}$ of the enhancement-mode HFET of FIG. 7 as a function of the impurity concentration level of the channel layer 12.

Referring to FIG. 9, the threshold voltage $V_{th}$ increases when the gate electrode 13A is formed to extend in the [01$\bar{1}$] direction as compared with the case in which the gate electrode 13A is formed to extend in the [011] direction. As a consequence, the drain leakage current in the turn-off state of the HFET is reduced when the gate electrode 13A is formed to extend in the [01$\bar{1}$] direction as compared with the case in which the gate electrode 13A is formed to extend in the [011] direction. The effect of FIG. 9 is also attributed to the piezoelectric charges inducted in the channel layer 12.

Figure 10:
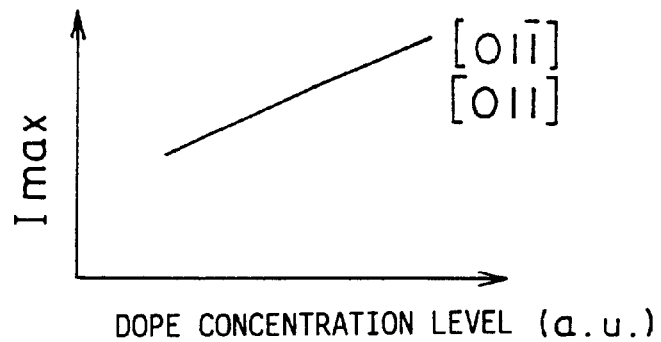
FIG. 10 is a diagram showing the maximum current in the HFET of FIG. 7.

FIG. 10 shows the relationship between the maximum current density $I_{max}$ and the doping concentration in the channel layer 12.

Referring to FIG. 10, it can be seen that the maximum current density $I_{max}$ increases with the doping concentration of the channel layer 12, while the maximum current density $I_{max}$ is not influenced substantially by the orientation of the gate electrode 13A.

Figure 11:
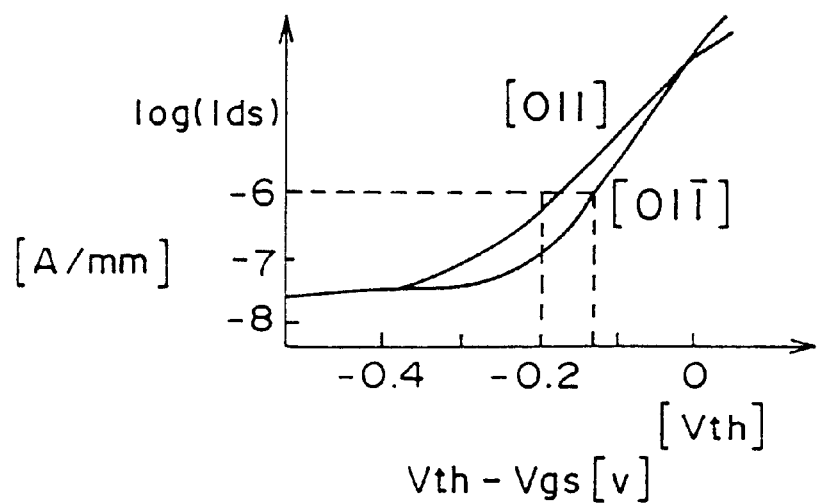
FIG. 11 is a diagram showing the sub-threashold region of the HFET of FIG. 7.

Further, FIG. 11 shows the $I_{ds}$–$Vg_{gs}$ characteristic in the sub-threshold region of the HFET of FIG. 7.

Referring to FIG. 11, it can be seen that the drain leakage current is reduced in the sub-threshold region, in which the gate voltage $V_{gs}$ is set smaller than the threshold voltage $V_{th}$, when the gate electrode 13A is formed to extend in the [01$\bar{1}$] direction as compared with the case in which the gate electrode 13A is formed to extend in the [011] direction.

In the state of the art portable telephones, the final stage power transistor used therein should be able to suppress the drain leakage current $I_{ds}$ for a unit gate width in the turn-off state ($V_{gs}$=0 V) of the power transistor, to the level of 1 $\mu$A or less ($\leq 1\times10^{-6}$ A/mm), assuming that a source-drain voltage $V_{ds}$ of 3 V is applied to the power transistor. In order to achieve this suppressed leakage current, a threshold voltage $V_{th}$ of about 0.2 V is necessary as long as the gate electrode 13A is formed to extend in the [011] direction. See FIG. 11, indicating that the gate voltage $V_{gs}$ must be set lower than the threshold voltage $V_{th}$ by 0.2V, in order to suppress the drain leakage current $I_{ds}$ below the level of $1\times10^{-6}$ A/mm. When this to be caused at the gate voltage $V_{gs}$ of 0 V, the threshold voltage $V_{th}$ has to be about 0.2 V or higher.

When the gate electrode 13A is formed to extend in the [01$\bar{1}$] direction, on the other hand, it can be seen from FIG. 11 that a threshold voltage $V_{th}$ of about 0.15 V is sufficient for suppressing the leakage current to the level below $1\times10^{-6}$ Amm.

In view of the relationship of FIG. 9 indicating the general tendency that the decrease of the threshold voltage $V_{th}$ is related to the increase of the doping concentration level in the channel layer 12, the foregoing result of FIG. 11 of reduced threshold voltage $V_{th}$ allows the use of an increased impurity concentration level in the channel layer 12, while simultaneously suppressing the drain leakage current $I_{ds}$. Thus, it can be seen, from the relationship of FIG. 10, that the maximum current density $I_{max}$ in the turn-on state of the enhancement-mode HFET of the present invention can be increased by increasing the doping concentration level in the channel layer 12. In other words, the present invention achieves the desired minimization of the drain leakage current in the turn-off state of the enhancement-mode HFET. Simultaneously, the present invention successfully maximizes the maximum current density in the turn-on state of the enhancement-mode HFET.

[First Embodiment]

Figure 12:
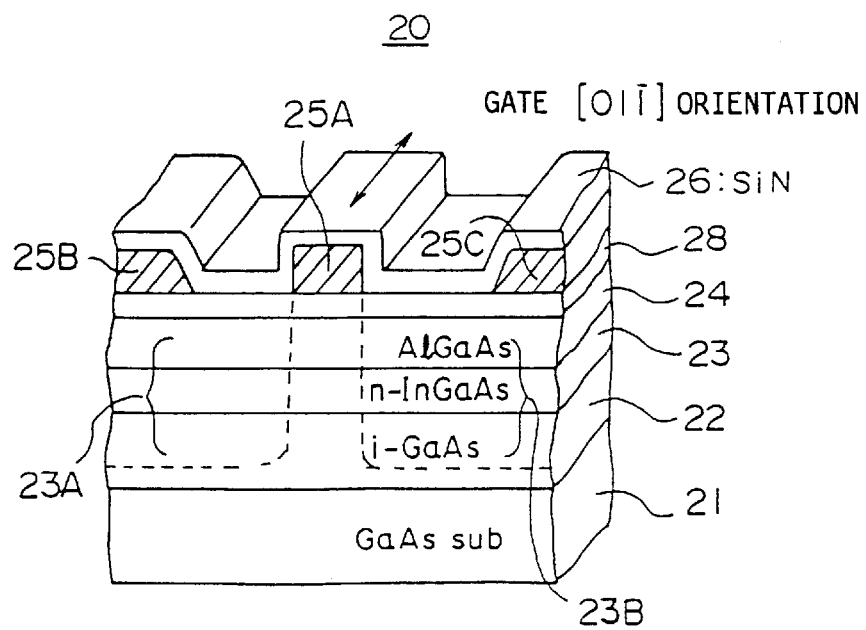
FIG. 12 is a diagram showing the construction of an HFET according to a first embodiment of the present invention.

FIG. 12 shows the construction of an HFET 20 according to a first embodiment of the present invention.

Referring to FIG. 12, the HFET 20 is constructed on the (100) surface of a semi-insulating GaAs substrate 21 and includes a buffer layer 22 of undoped GaAs formed on the substrate 21 with a thickness of about 100 nm, a channel layer 23 of InGaAs doped to the n-type with an impurity concentration level of about $2\times10^{17}$ cm$^{-3}$ and formed on the buffer layer 22 with the thickness of about 14 nm, a barrier layer 24 of undoped AlGaAs having a composition of $Al_{0.5}Ga_{0.5}As$ and formed on the channel layer 23 with a thickness of about 20 nm, a cap layer 28 of an undoped GaAs formed on the barrier layer 24, and a gate electrode 25A of WSi formed on the cap layer 28 in correspondence to a channel region CH defined in the channel layer 23. Further, a pair of low-resistance diffusion regions 23A and 23B are formed at both lateral sides of the gate electrode 25A, wherein the diffusion regions 23A and 23B are formed by conducting an ion implantation process of $Si^+$ into the substrate 21 through the barrier layer 24 and the channel layer 23 under an acceleration voltage of 60 keV and a dose of about $2\times10^{13}$ $cm^{-2}$. After the ion implantation process, the Si ions thus introduced are activated by conducting a thermal annealing process at about 800° C. for 5 seconds. In the construction of FIG. 12, it should be noted that the gate electrode 13A extends in the [01$\bar{1}$] direction of the GaAs substrate 21.

In the construction of FIG. 12, it should further be noted that an ohmic electrode 25B having an AuGe/Ni/Au structure is formed on the barrier layer 24 in correspondence to the low-resistance diffusion region 23A. Further, a similar ohmic electrode 25C of the AuGe/Ni/Au structure is formed on the barrier layer 24 in correspondence to the low-resistance diffusion region 23B. Thereby, the gate electrode 25A, the ohmic electrode 25B and the ohmic electrode 25C are covered by a passivation film 26 of SiN.

In the HFET 20 of the present embodiment, it should be noted that there is induced a compressive stress field in the channel layer 23 by the passivation film 26. When the gate electrode 25A is formed so as to extend in the [01$\bar{1}$] direction (the gate width direction coincides with the [01$\bar{1}$] direction) on such a structure, a threshold voltage $V_{th}$ of 0.4 V is obtained. Further, a drain leakage current of 0.05 $\mu$A/mm is achieved in the turn-off state of the HFET 20. Further, a value of 380 mA/mm is obtained for the maximum current density $I_{max}$ when a voltage of 2.5 V is applied to the gate electrode 25A as the gate voltage $V_{gs}$.

When the gate electrode 25A is formed to extend in the [011] direction on the same semiconductor layered structure, on the other hand, the HFET shows a reduced threshold voltage $V_{th}$ of 0.25 V and an increased drain leakage current 0.5 $\mu$A/mm in the turn-off state of the HFET. Only the maximum current density $I_{max}$ at the time of the gate voltage $V_{gs}$ of 2.5 V remains the same and takes the value of 380 mA/mm.

The foregoing result indicates that piezoelectric charges similar to the piezoelectric charges in an ordinary MESFET are induced also in the channel layer 23 of the HFET 20 of the present embodiment in correspondence to the gate electrode 25A even when the barrier layer 24 is interposed between the channel layer 23 and the gate electrode 25A. As a result of such formation of the piezoelectric charges, it becomes possible to maximize the current density in the turn-on state of the HFET 20 and simultaneously minimize the drain leakage current in the turn-off state by optimizing the orientation of the gate electrode 25A.

In the present embodiment, it is also possible to use a GaAs layer of the n-type for the channel layer 23 in place of the n-type InGaAs layer. Further, it is also possible to use an AlGaAs layer of the $n^-$-type for the barrier layer 24 in place of the undoped AlGaAs layer. As long as the impurity concentration level in the barrier layer 24 is lower than about $1\times10^{17}$ $cm^{-3}$, it is possible to avoid the increase of the gate current even in such a case in which the gate voltage $V_{gs}$ is increased. Thereby, a large drain current $I_{ds}$ is obtained.

[Second Embodiment]

Figure 13:
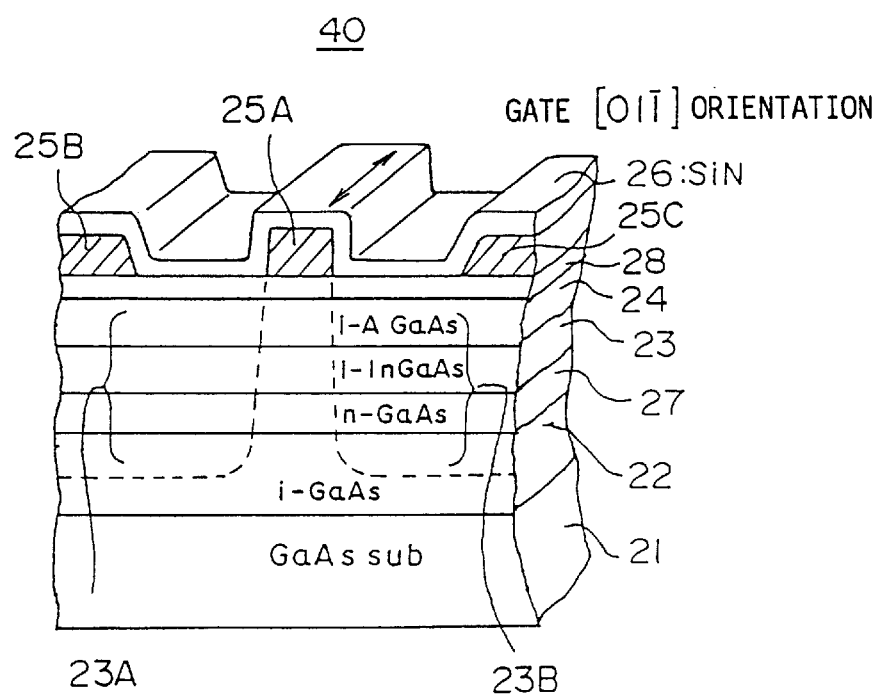
FIG. 13 is a diagram showing the construction of an HFET according to a second embodiment of the present invention.

FIG. 13 shows the construction of the HFET 40 according to a second embodiment of the present invention, wherein those parts corresponding to the parts described previously are designated by the same reference numerals and the description thereof will be omitted.

Referring to FIG. 13, the HFET 40 of the present embodiment uses an undoped InGaAs layer for the channel layer 23, and there is interposed a layer 27 of n-type GaAs between the buffer layer 22 of the undoped GaAs and the channel layer 23. It should be noted that the GaAs layer 27 has a wide bandgap as compared with the channel layer 23 of InGaAs.

By forming the gate electrode 25A to extend in the [01$\bar{1}$] direction on the foregoing semiconductor layered structure, it becomes possible to achieve the maximum current density $I_{max}$ in the turn-on state of the HFET 40 of as much as 420 mA/mm in the state that a voltage of 2.5 V is applied to the gate electrode 25A as the gate voltage $V_{gs}$. The HFET 40 thus formed further has the threshold voltage $V_{th}$ of 0.3 V and the drain leakage current of 0.07 $\mu$A/mm in the turn-off state.

In the case the gate electrode 25A is formed to extend in the [011] direction, on the other hand, the threshold voltage $V_{th}$ is reduced to 0.15 V and the drain leakage current in the turn-off state of the HFET is increased to about 2 $\mu$m/mm. Only the maximum current density $I_{ds}$ in the turn-on state maintains the value of 420 mA/mm in the state that the voltage of 2.5 V is applied to the gate electrode 25A as the gate voltage $V_{gs}$.

The foregoing result indicates that piezoelectric charges similar to the piezoelectric charges in an ordinary MESFET are induced also in the channel layer 23 of the HFET 40 of the present embodiment in correspondence to the gate electrode 25A even when the barrier layer 24 is interposed between the channel layer 23 and the gate electrode 25A and the GaAs layer 27 is interposed between the buffer layer 22 and the channel layer 23. As a result of such formation of the piezoelectric charges, it becomes possible to maximize the current density in the turn-on state of the HFET 40 and simultaneously minimize the drain leakage current in the turn-off state by optimizing the orientation of the gate electrode 25A.

In the present embodiment, it should be noted that a layer of undoped GaAs may be used for the channel layer 23 in place of the undoped InGaAs layer. Further, it is also possible to use a layer of $n^-$-type AlGaAs for the barrier layer 24 in place of the undoped AlGaAs layer. Further, it is also possible to replace the n-type GaAs layer 27 by an n-type AlGaAs layer.

In the embodiments described heretofore, it was assumed that the gate electrode 25A is formed of WSi and the passivation film 26 is formed of SiN. However, the present invention is not limited to such a particular combination of the materials and it is also possible to use various refractory metal compounds such as WSiN, WN, TiW, TiWN, and the like, for the gate electrode 25A. Further, it is also possible to use $SiO_2$ for the passivation film 26 in place of SiN. The GaAs cap layer 28 may be omitted. In this case, the HFET may have the structure similar to that of FIG. 7.

It should be noted that the distribution of the piezoelectric charges in the channel layer 23 changes depending on the stress field formed by the gate electrode, the barrier layer and the channel layer. Thus, the optimum gate orientation for inducing negative piezoelectric charges in the channel layer is not limited to the foregoing [01$\bar{1}$] direction. In the system in which a tensile stress field is induced underneath the gate electrode, the optimum direction of the gate electrode may be the [011] direction.

As explained before, the stress field in the channel layer is caused primarily as a result of the passivation film used to cover the HFET. When SiN is used for the passivation film 26, for example, a compressive stress field is induced generally in the channel layer 23. When $SiO_2$ is used for the passivation film 26, on the other hand, a tensile stress field is tend to be induced in the channel layer 23. Further, the stress field in the channel layer may change depending on the deposition condition or deposition process of the passivation film. In any event, the present invention chooses the orientation of the gate electrode such that negative piezoelectric charges are induced in the channel layer.

Further, the present invention is not limited to the embodiments described heretofore, but various variations and modifications may be made without departing from the scope of the invention.

For example, it is possible to interpose a suitable layer between the barrier layer and the gate electrode such as a buffer layer for protecting the surface of the barrier layer.

What is claimed is:

1. An enhancement-mode semiconductor device, comprising:

a channel layer;

a barrier layer formed on said channel layer, said barrier layer having a bandgap larger than a bandgap of said channel layer;

a gate electrode provided on said barrier layer;

a pair of diffusion regions formed in said barrier layer at both lateral sides of said gate electrode, each of said diffusion regions reaching said channel layer;

a pair of ohmic electrodes formed respectively on the pair of diffusion regions;

said gate electrode being formed with an orientation, with respect to a crystallographic orientation of said substrate, chosen so as to maximize a threshold voltage of said semiconductor device, wherein said channel layer has a (100)-oriented principal surface and experiences a compressive stress field, and wherein said gate electrode extends in a $[01\bar{1}]$ direction.

2. The enhancement-mode semiconductor device as claimed in claim 1, wherein piezoelectric charges are formed in said channel layer.

3. The enhancement-mode semiconductor device as claimed in claim 1, wherein said channel layer is formed of a compound semiconductor material selected from a group consisting of GaAs and InGaAs, and wherein said barrier layer is formed of AlGaAs.

4. The enhancement-mode semiconductor device as claimed in claim 1, wherein negative piezoelectric charges are induced in said channel layer in correspondence to said gate electrode.

5. The enhancement-mode semiconductor device as claimed in claim 1, wherein said barrier layer contains an impurity element with a concentration level of $1 \times 10^{17}$ cm$^{-3}$ or less.

6. The enhancement-mode semiconductor device as claimed in claim 1, wherein there is further provided a doped semiconductor layer underneath said channel layer, said doped semiconductor layer having a bandgap larger than a bandgap of said channel layer.

* * * * *